United States Patent
Mei et al.

(10) Patent No.: US 11,393,732 B2
(45) Date of Patent: Jul. 19, 2022

(54) METHOD FOR TESTING ELECTRICAL PERFORMANCE OF PACKAGED CHIP

(71) Applicant: MONTAGE TECHNOLOGY (KUNSHAN) CO., LTD., Jiangsu (CN)

(72) Inventors: Meng Mei, Suzhou (CN); Gang Shi, Suzhou (CN); Peichun Wang, Suzhou (CN); Guangfeng Li, Suzhou (CN)

(73) Assignee: MONTAGE TECHNOLOGY (KUNSHAN) CO., LTD., Suzhou (CN)

(*) Notice: Subject to any disclaimer, the term of this patent is extended or adjusted under 35 U.S.C. 154(b) by 0 days.

(21) Appl. No.: 17/272,766

(22) PCT Filed: May 15, 2020

(86) PCT No.: PCT/CN2020/090699
§ 371 (c)(1),
(2) Date: Mar. 2, 2021

(87) PCT Pub. No.: WO2021/208177
PCT Pub. Date: Oct. 21, 2021

(65) Prior Publication Data
US 2022/0148932 A1    May 12, 2022

(30) Foreign Application Priority Data
Apr. 17, 2020  (CN) .......................... 202010306983.7

(51) Int. Cl.
*H01L 33/48* (2010.01)
*H01L 21/66* (2006.01)
*H01L 23/00* (2006.01)

(52) U.S. Cl.
CPC .............. *H01L 22/34* (2013.01); *H01L 24/11* (2013.01); *H01L 24/13* (2013.01); *H01L 24/94* (2013.01);
(Continued)

(58) Field of Classification Search
CPC .............. H01L 33/48; H01L 2933/0033; H01L 2933/0041; H01L 2933/005;
(Continued)

(56) References Cited

U.S. PATENT DOCUMENTS

2018/0067888 A1* 3/2018 Sheth .................. G06F 15/7817
2018/0204828 A1* 7/2018 Lu .......................... H01L 22/32

FOREIGN PATENT DOCUMENTS

CN          110494964 A      11/2019

OTHER PUBLICATIONS

Jan. 15, 2021 Written Opinion issued in International Patent Application No. PCT/CN2020/090699.

* cited by examiner

*Primary Examiner* — Mohammad M Choudhry
(74) *Attorney, Agent, or Firm* — Oliff PLC (57) ABSTRACT

A method for manufacturing an electrical performance test structure of packaged chip, and a method for testing electrical performance of packaged chip, including: providing a first wafer and a second wafer, forming a top metal layer on the first wafer and the second wafer respectively, forming bumps on part of the top metal layer of the first wafer and on part of the top metal layer of the second wafer respectively, removing the top metal layer that is not directly beneath the bumps in the first wafer, and completely retaining the top metal layer in the second wafer, and packaging the first wafer to a first die and packaging the second wafer to a second die, wherein the second die is used as a test structure, and the electrical performance of the second die is used as a reference for electrical performance of the first die.

15 Claims, 6 Drawing Sheets

(52) U.S. Cl.
CPC ............... *H01L 2224/1145* (2013.01); *H01L 2224/1147* (2013.01); *H01L 2224/11462* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01)

(58) Field of Classification Search
CPC ..... H01L 2933/0058; H01L 2933/0066; H01L 2933/0075
See application file for complete search history.

METHOD FOR TESTING ELECTRICAL PERFORMANCE OF PACKAGED CHIP

FIELD

The present invention generally relates to technical field of packaged chip test, in particular to a method for manufacturing an electrical performance test structure of packaged chip and a method for testing electrical performance of packaged chip.

BACKGROUND

Semiconductor integrated circuit chips refer to silicon chips containing integrated circuits, which are small and often part of a computer or other electronic equipment. Chip packaging is packaging of semiconductor integrated circuit chips with insulating materials, and pins of the packaged chips are connected to other devices through a printed circuit board. In order to ensure the reliability of the chip shipped out from a factory, it is necessary to test the packaged chip before shipped out from the factory to ensure functional integrity.

The traditional method of measuring the electrical performance of a packaged chip is to add a large amount of solder to the bump area of the packaged chip for short-circuiting the bump area, connect the packaged chip to a circuit board, and set up a conductive structure for testing on the other side of the circuit board. Then, use the probe to contact the conductive structure and measure the electrical performance of the packaged chip through a vector network analyzer. In this method, since the area where the packaged chip is connected to the circuit board is covered with green oil, the shorting-circuiting effect of the solder is poor, resulting in deviations in the electrical performance test results.

SUMMARY

The object of the present application is to provide a method for testing electrical performance of packaged chip, which enhances the short-circuiting effect for the bump, thereby enhancing the contact performance between the bump and the probe, and improving the reliability of the test.

An embodiment of the application discloses a method for manufacturing electrical performance test structure of packaged chip, comprising:

providing a first wafer and a second wafer;

forming a top metal layer on the first wafer and the second wafer respectively;

forming bumps on a part of the top metal layer of the first wafer and on a part of the top metal layer of the second wafer respectively;

removing the top metal layer that is not directly beneath the bumps in the first wafer and completely retaining the top metal layer in the second wafer; and packaging the first wafer to form a first die and packaging the second wafer to form a second die, wherein the second die is used as a test structure, and an electrical performance of the second die is used as a reference for an electrical performance of the first die.

In some embodiments, the step of forming bumps on a part of the top metal layer further comprises:

depositing a patterned photoresist on the top metal layer, wherein the patterned photoresist exposes said part of the top metal layer;

forming bumps on the exposed part of the top metal layer by an electroplating process; and removing the patterned photoresist.

In some embodiments, the bumps comprise one of copper, nickel, tin, and silver or any combination thereof.

In some embodiments, the top metal layer is formed by a sputtering process, and the top metal layer comprises one of copper, titanium, gold, silver, nickel, and tin or any combination thereof.

In some embodiments, the first wafer comprises a transistor, an interconnection structure and a control circuit.

In some embodiments, the step of packaging the first wafer to form a first die and packaging the second wafer to form a second die, further comprises: packaging the first wafer and the second wafer by the same packaging process.

Another embodiment of the present application also discloses method for testing electrical performance of packaged chip, the method for testing electrical performance comprises:

using a test structure manufactured by the foregoing manufacturing method;

disposing the test structure on a side of a substrate, wherein the bumps of the test structure are connected to the side of the substrate, and the other side of the substrate opposite to the test structure is provided with a conductive structure for testing; and using a probe to electrically contact with the conductive structure to test electrical performance of the test structure.

In some embodiments, the electrical performance comprises resistance performance and inductance performance In some embodiments, the substrate comprises a printed circuit board, a flexible circuit board, a ceramic substrate, or an organic substrate.

In some embodiments, the conductive structure comprises a solder ball.

In the present application, by using the second die as a test structure in which the surface of the second die is completely covered by the top metal layer, the connection performance between the top metal layer and the bumps can be better, so that the short-circuiting effect is good during the test, thereby improving the reliability of the test. In addition, the second die adopts the same metal layer process and packaging process with the first die (comprising a control circuit, etc.) as a product, no additional process is required, and the test cost is lower.

BRIEF DESCRIPTION OF THE DRAWINGS

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
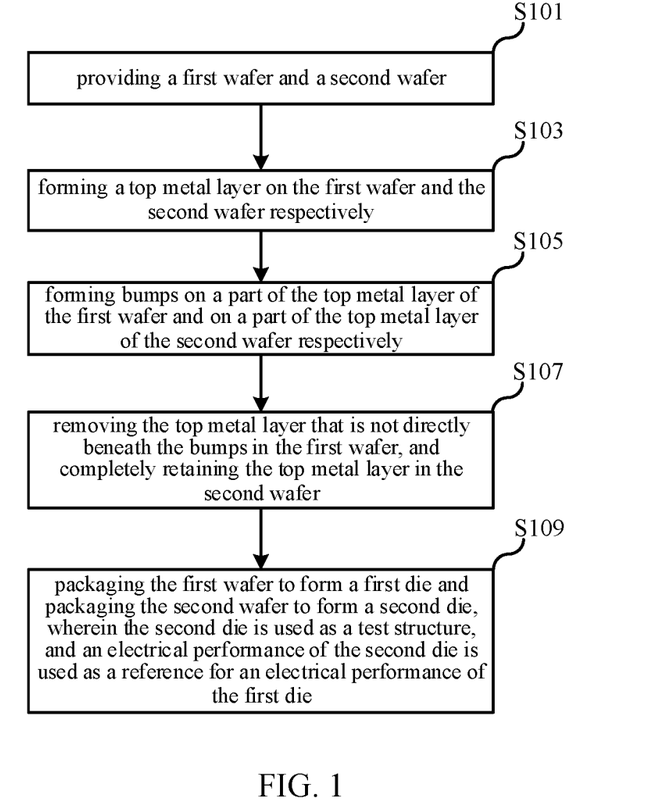
FIG. 1 is a flowchart of a method for manufacturing an electrical performance test structure of packaged chip in an embodiment of the present application.
Figure 2:
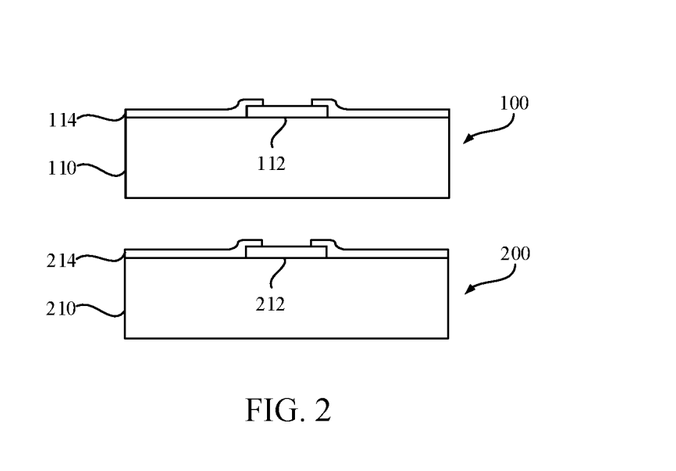
FIG. 2 is a schematic diagram of a first wafer and a second wafer according to an embodiment of the present application.

An embodiment of the present application discloses a method for manufacturing an electrical performance test structure of packaged chip. FIG. 1 shows a flow chart of the test structure manufacturing method. FIGS. 2 to 6 show schematic diagrams of the structures corresponding to each step of FIG. 1. The method comprises:

Step S101, providing a first wafer 100 and a second wafer 200. As shown in FIG. 2, the wafer refers to a substrate in which devices can be formed, for example, a silicon substrate, a silicon germanium substrate, a gallium arsenide substrate, etc., the devices may refer to CMOS circuits, for example, a structure that may include one or more transistors, interconnection structures, and control circuits, etc., for realizing specific functions. Other device structures may also be formed in the wafer, such as one or more amplifiers, digital/analog converters, analog processing circuits and/or digital processing circuits, and interface circuits, etc. These device structures may be formed by CMOS processes. The first wafer 100 is used to form normal chip products, that is, devices are formed in the first wafer 100. The second wafer 200 is used for testing, that is, no devices are formed in the second wafer 200, only metal layers and bumps required for testing are formed, and the electrical performance of the chip product can be obtained according to the test result of the second wafer. The first wafer 100 and the second wafer 200 are respectively formed with pads 112, 212 and passivation layers 114, 214, the passivation layers 114, 214 partially cover the pads 112, 212 respectively, and the passivation layers 114, 214 may be nitrogen Silicon(SiN).

Figure 3:
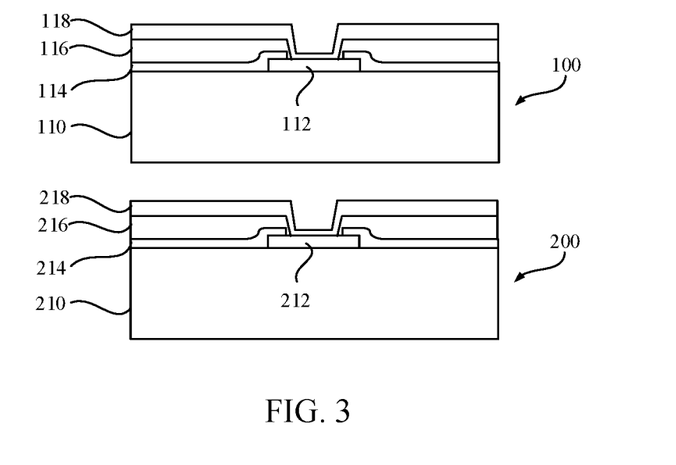
FIG. 3 is a schematic diagram of forming a polyimide layer and a top metal layer according to an embodiment of the present application.

In one embodiment, referring to FIG. 3, forming polyimide layers 116, 216 on the substrates 110, 210 respectively, and the polyimide layers 116, 216 are used to relieve stress of the underlying substrates 110, 210 respectively. It should be understood that the polyimide layers 116, 216 are optional, and in other embodiments, the polyimide layers 116, 216 may not be formed.

Step S103, continuing to refer to FIG. 3, forming top metal layers 118, 218 on the first wafer 100 and the second wafer 200, respectively. Those skilled in the art should be well aware that in the chip manufacturing process, multiple metal layers, for example, 3 to 5 metal layers, need to be formed to achieve electrical connection. In this embodiment, the top metal layer refers to an uppermost metal layer or an under bump metallization in the process. In one embodiment, the top metal layer is formed by using sputtering process. The top metal layer 118, 218 may comprise one of copper (Cu), titanium (Ti), gold (Au), silver (Ag), nickel (Ni), tin (Sn) or any combination thereof, for example, the top metal layer is formed by sputtering copper or titanium. The thickness of the top metal layer 118, 218 may be 300 nm to 600 nm, such as 300 nm, 400 nm, 600 nm, and so on.

Figure 4:
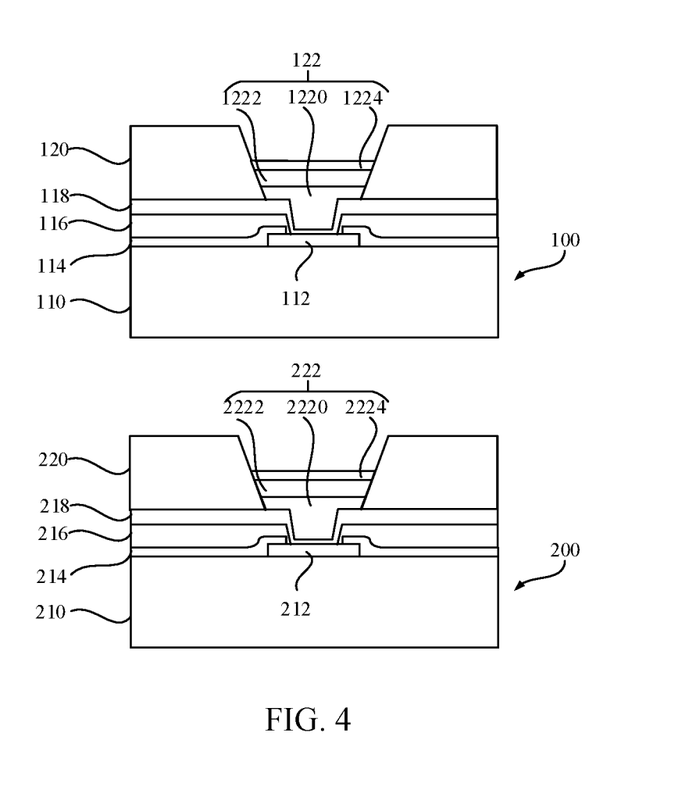
FIG. 4 is a schematic diagram of forming a patterned photoresist and bumps according to an embodiment of the present application.

Step S105, referring to FIG. 4, forming bumps 122, 222 on a part of the top metal layers 118 and 218, respectively. In one embodiment, the step S105 of forming bumps on a part of the top metal layer further comprises:

depositing patterned photoresists (PR) 120, 220 on the top metal layers 118, 218, respectively, and the patterned photoresists 120, 220 expose another part of the top metal layers 118, 218 and the pads 112, 212. It should be understood that the patterned photoresist can be formed by a process known in the art or known in the future, and will not be repeated here.

Then, the step S105 further comprises: growing bumps 122, 222 respectively on the top metal layers 118, 218 not covered by the patterned photoresist by using electroplating deposition (ECD) process. In an embodiment, the bumps 122, 222 may comprise one of copper, nickel, tin, and silver or any combination thereof. The thickness of the bumps 122, 222 may be 38 µm~95 µm, for example, 40 µm, 50 µm, 60 µm, 65 µm, 78 µm, 86 µm, 90 µm, etc. For example, the bumps 122, 222 respectively comprise a first metal layer 1220, 2220, a second metal layer 1222, 2222, and a third metal layer 1224, 2224 which are sequentially stacked, and the first metal layer 1220, 2220 may be copper metal layers. The second metal layers 1222, 2222 may be nickel metal layers. The third metal layers 1224, 2224 may be tin-silver solder layers.

In another embodiment, the bumps 122, 222 may comprise two metal layers, for example, a first metal layer and a second metal layer, the first metal layers may be nickel metal layers, and the second metal layers may be solder layer, for example, lead-free solder layer (LF solder).

Figure 5:
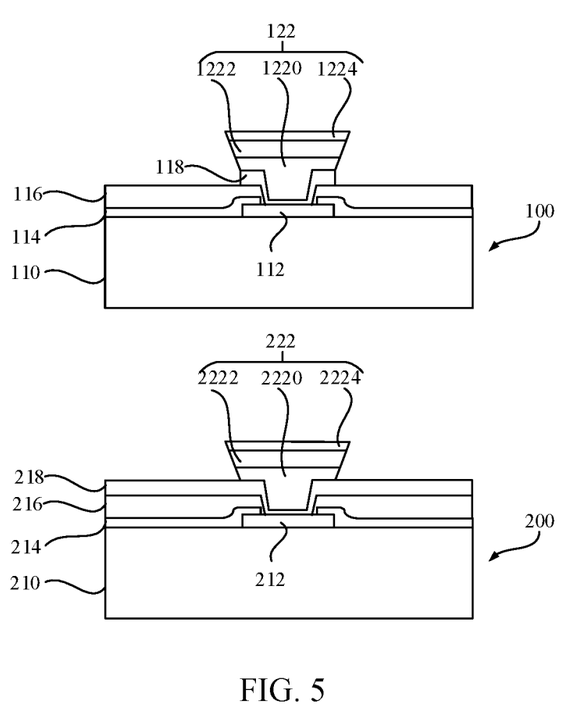
FIG. 5 is a schematic diagram of removing the patterned photoresist and the top metal layer according to an embodiment of the present application.

After that, referring to FIG. 5, the step S105 further comprises: removing the patterned photoresist 120, 220, for example, the photoresist 120, 220 are removed by a plasma etching process or an ashing process.

Step S107, referring to FIG. 5, removing the top metal layer 118 that is not directly beneath the bumps 122, and retaining the top metal layer 218 in the second wafer 200 completely. In this embodiment, the part of the top metal layer 118 that is not removed is used for interconnection, and the top metal layer 218 of the second wafer 200 does not need to be interconnected, and is only used for electrical performance test, so it does not need to be removed. In this embodiment, a wet etching process may be used to remove the top metal layer.

In this embodiment, since the top metal layer in the second wafer is an unetched metal layer, the surface of the top metal layer in the second wafer is flat, and the contact performance between the top metal layer and the bumps is good.

Figure 6:
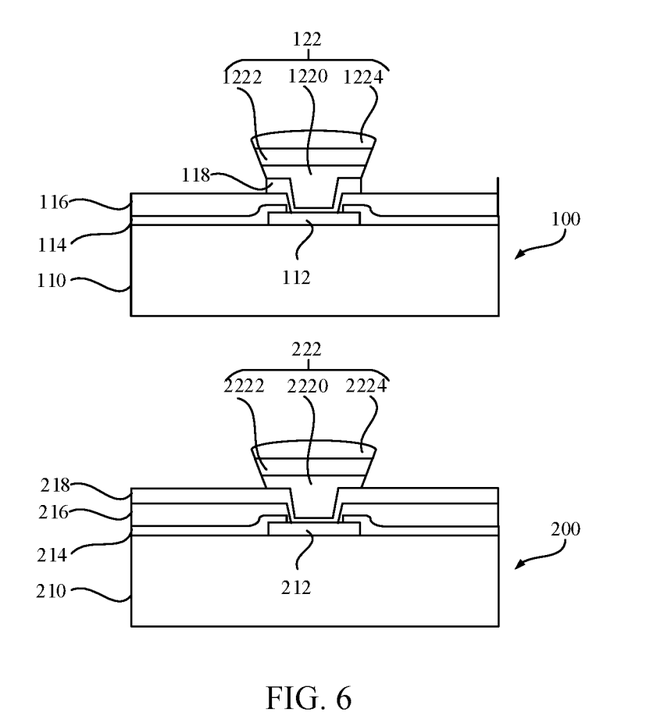
FIG. 6 is a schematic diagram of a reflow soldering process for bumps according to an embodiment of the present application.

As shown in FIG. 6, in an embodiment, the manufacturing method further comprises performing a reflow process on the bumps 122, 222.

Step S109, packaging the first wafer 100 and the second wafer 200 respectively to form a first die and a second die, the second die is used as a test structure, and the electrical performance of the second die is used as reference for the electrical performance of the first die. In one embodiment, in step S109, the step of packaging the first wafer 100 and the second wafer 200 respectively to form a first die and a second die, further comprises: packaging a first wafer and a second wafer by the same packaging process. In this embodiment, the wafer can be packaged by a technology well known to those skilled in the art, which will not be repeated here. In this embodiment, the structure of the second die is shown as 200' in FIG. 8. The second die 200' comprises a substrate 210', a top metal layer 218' located on the substrate 210', and bumps 222' connected to the top metal layer. In this embodiment, the second die uses the same metal layer process and packaging process with the first die (comprising control circuit, etc.) as a chip product, there is no additional process and the test cost is lower.

Figure 7:
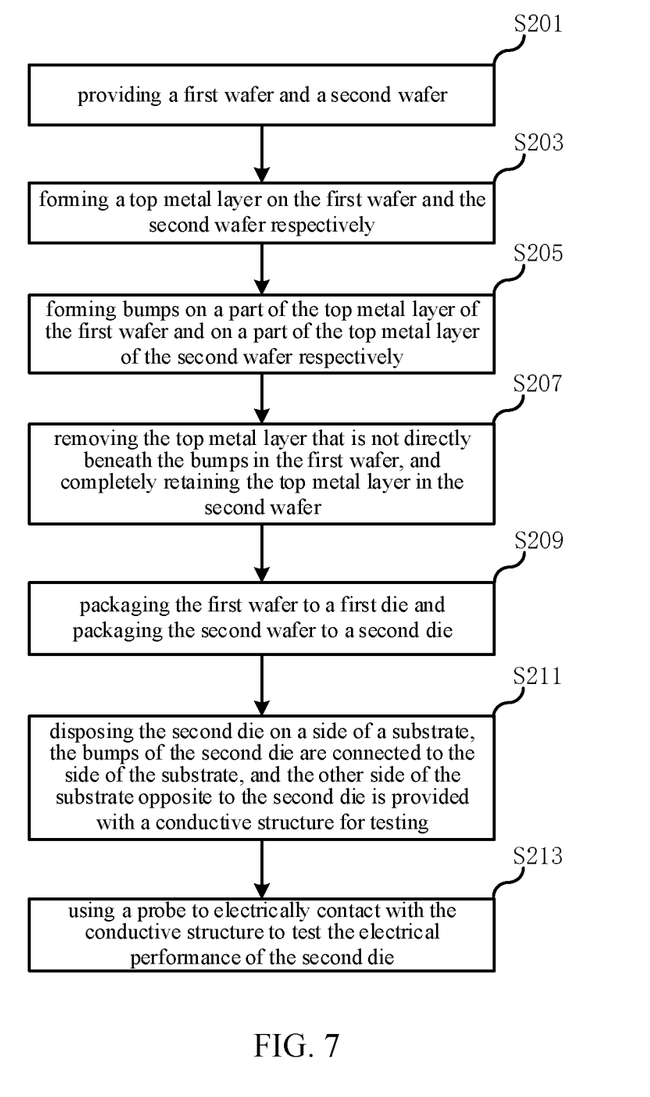
FIG. 7 is a flowchart of a method for testing electrical performance of packaged chip according to an embodiment of the present application.

An embodiment of the present application discloses a method for testing electrical performance of packaged chip. FIG. 7 shows a flowchart of the electrical performance testing method for packaged chip. Steps S201 to S209 are similar to the aforementioned S101 to S109. The method comprising:

Step S201, providing a first wafer and a second wafer;

Step S203, forming a top metal layer on the first wafer and the second wafer respectively;

Step S205, forming bumps on a part of the top metal layer of the first wafer and on a part of the top metal layer of the second wafer respectively;

Step S207, removing the top metal layer that is not directly beneath the bumps in the first wafer, and completely retaining the top metal layer in the second wafer;

Step S209, packaging the first wafer to form a first die and packaging the second wafer to form a second die;

Step S211, disposing the second die on a side of a substrate, the bumps of the second die are connected to the side of the substrate, and the other side of the substrate opposite to the second die is provided with a conductive structure 310 for testing. In an embodiment, the substrate may comprise a printed circuit board (PCB), a flexible circuit board (FPC) or an organic substrate, pads (PAD) for electrical connection are provided on the substrate, and the bumps of the test structure are connected to the pads of the substrate. In one embodiment, an encapsulant is used to connect the test structure and the substrate to reinforce the connection between the die and the substrate. In one embodiment, the conductive structure may be solder balls.

Step S213, using a probe to electrically contact the conductive structure 310 to test electrical performance of the second die 200', and the electrical performance of the second die 200' is used as a reference for the electrical performance of the first die. In an embodiment, the electrical performance comprises resistance performance and inductance performance.

Figure 8:
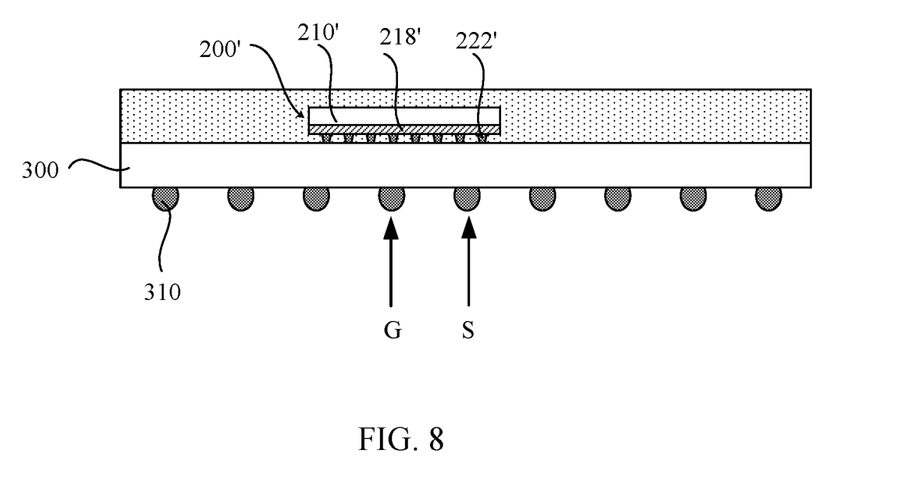
FIG. 8 is a schematic diagram of the electrical performance test process according to an embodiment of the present application.

FIG. 8 shows a schematic diagram of an electrical performance test process in an embodiment. The second die 200' are disposed upside down on a side of the substrate 300, the bumps 222' are electrically connected to pads (not shown in the figure) on the substrate 300, and an encapsulant (not shown in the figure) is provided between the bumps 222' and the substrate 300, solder balls 310 are provided on the other side of the substrate 300 opposite to the second die 200'. When testing the electrical performance, two probes (shown by the arrow in the figure) are used to contact the solder balls 310, an end of one probe is grounded (G), and an end of the other probe is connected to the signal end (S). The vector network analyzer measures the resistance value and the inductance value of the die respectively, and the vector network analyzer measures the resistance value and the inductance value by a method known to those skilled in the art, which will not be repeated here. The following table 1 shows the results of the resistance value (R) and inductance value (H) measured by the present application and the existing test method. In the following table 1, only the signal DAC1 is used as an example, and 6 different samples are tested respectively. Of course, those skilled in the art may test QACA13 and other signals. It can be seen from table 1 below that the test method of the present application significantly improves the resistance value test, the standard deviation of the resistance value is reduced from 38.5667 to 0.0568, and the inductance value test is also improved to a certain extent.

TABLE 1

Test results of electrical performance

| Signal (DAC1) | Existing test method | | Test method of the application | |
|---|---|---|---|---|
| | Inductance value (nH) | Resistance value (Ω) | Inductance value (nH) | Resistance value (Ω) |
| Sample 1 | 2.34 | 16 | 3.23 | 5.8 |
| Sample 2 | 2.11 | 20 | 2.69 | 6.07 |
| Sample 3 | 2.63 | 6 | 2.76 | 6.43 |
| Sample 4 | 2.49 | 12 | 2.76 | 6.1 |
| Sample 5 | 2.6 | 8 | 2.68 | 5.8 |
| Sample 6 | 2.05 | 21 | 2.76 | 5.92 |
| Standard deviation | 0.0612 | 38.5667 | 0.0430 | 0.0568 |

It should be noted that in the application documents of the present patent, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "include one" does not exclude that there are other identical elements in the process, method, article, or equipment that includes the element. In the application file of this patent, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification shall be included in the protection scope of one or more embodiments of this specification.

In some cases, the actions or steps described in the claims may be performed in a different order than in the embodiments and still achieve desired results. In addition, the processes depicted in the drawings do not necessarily require the specific order or sequential order shown to achieve the desired result. In certain embodiments, multi-tasking and parallel processing are also possible or may be advantageous.

What is claimed is:

1. A method for manufacturing an electrical performance test structure of packaged chip, comprising:
    providing a first wafer and a second wafer;
    forming a top metal layer on the first wafer and the second wafer respectively;
    forming bumps on a part of the top metal layer of the first wafer and on a part of the top metal layer of the second wafer respectively;
    removing the top metal layer that is not directly beneath the bumps in the first wafer and completely retaining the top metal layer in the second wafer; and
    packaging the first wafer to form a first die and packaging the second wafer to form a second die, wherein the second die is used as a test structure, and an electrical performance of the second die is used as a reference for an electrical performance of the first die.

2. The method for manufacturing the test structure according to claim 1, wherein the step of forming bumps on a part of the top metal layer further comprises:
    depositing a patterned photoresist on the top metal layer, wherein the patterned photoresist exposes said part of the top metal layer;
    forming bumps on the exposed part of the top metal layer by an electroplating process; and
    removing the patterned photoresist.

3. The method for manufacturing the test structure according to claim 2, wherein the bumps comprise one of copper, nickel, tin, and silver or any combination thereof.

4. The method for manufacturing the test structure according to claim 1, wherein the top metal layer is formed by a sputtering process, and the top metal layer comprises one of copper, titanium, gold, silver, nickel, and tin or any combination thereof.

5. The method for manufacturing the test structure according to claim 1, wherein the first wafer comprises a transistor, an interconnection structure and a control circuit.

6. The method for manufacturing the test structure according to claim 1, wherein the step of packaging the first wafer to form a first die and packaging the second wafer to form a second die, further comprises: packaging the first wafer and the second wafer by the same packaging process.

7. A method for testing electrical performance of packaged chip, comprising:
    providing a first wafer and a second wafer;
    forming a top metal layer on the first wafer and the second wafer respectively;
    forming bumps on a part of the top metal layer of the first wafer and on a part of the top metal layer of the second wafer respectively;
    removing the top metal layer that is not directly beneath the bumps in the first wafer, and completely retaining the top metal layer in the second wafer;
    packaging the first wafer to form a first die and packaging the second wafer to form a second die, the second die is used as a test structure;
    disposing the test structure on a side of a substrate, wherein the bumps of the test structure are connected to the side of the substrate, and the other side of the substrate opposite to the test structure is provided with a conductive structure for testing; and
    using a probe to electrically contact with the conductive structure to test electrical performance of the test structure.

8. The method for testing electrical performance of packaged chip according to claim 7, wherein the electrical performance comprises resistance performance and inductance performance.

9. The method for testing electrical performance of packaged chip according to claim 7, wherein the substrate comprises a printed circuit board, a flexible circuit board, a ceramic substrate, or an organic substrate.

10. The method for testing electrical performance of packaged chip according to claim 7, wherein the conductive structure comprises a solder ball.

11. The method for testing electrical performance of packaged chip according to claim 7, wherein the step of forming bumps on a part of the top metal layer further comprises:
    depositing a patterned photoresist on the top metal layer, wherein the patterned photoresist exposes said part of the top metal layer;
    forming bumps on the exposed part of the top metal layer by an electroplating process; and
    removing the patterned photoresist.

12. The method for testing electrical performance of packaged chip according to claim 11, wherein the bumps comprise one of copper, nickel, tin, and silver or any combination thereof.

13. The method for testing electrical performance of packaged chip according to claim 7, wherein the top metal layer is formed by a sputtering process, and the top metal layer comprises one of copper, titanium, gold, silver, nickel, and tin or any combination thereof.

14. The method for testing electrical performance of packaged chip according to claim 7, wherein the first wafer comprises a transistor, an interconnection structure and a control circuit.

15. The method for testing electrical performance of packaged chip according to claim 7, wherein the step of packaging the first wafer to form a first die and packaging the second wafer to form a second die, further comprises: packaging the first wafer and the second wafer by the same packaging process.

* * * * *